United States Patent
Ramchen et al.

(10) Patent No.: US 10,217,915 B2
(45) Date of Patent: Feb. 26, 2019

(54) OPTOELECTRONIC SEMICONDUCTOR COMPONENT

(71) Applicant: OSRAM Opto Semiconductors GmbH, Regensburg (DE)

(72) Inventors: Johann Ramchen, Altdorf (DE); David Racz, Regensburg (DE); Hans-Christoph Gallmeier, Regensburg (DE); Stefan Grötsch, Bad Abbach (DE); Simon Jerebic, Tegernheim (DE)

(73) Assignee: OSRAM Opto Semiconductors GmbH (DE)

(*) Notice: Subject to any disclaimer, the term of this patent is extended or adjusted under 35 U.S.C. 154(b) by 0 days.

(21) Appl. No.: 15/730,214

(22) Filed: Oct. 11, 2017

(65) Prior Publication Data

US 2018/0033931 A1 Feb. 1, 2018

Related U.S. Application Data

(62) Division of application No. 13/703,127, filed as application No. PCT/EP2011/059738 on Jun. 10, 2011, now Pat. No. 9,818,921.

(30) Foreign Application Priority Data

Jun. 24, 2010 (DE) .................. 10 2010 024 864

(51) Int. Cl.
*H01L 33/60* (2010.01)
*H01L 33/46* (2010.01)
(Continued)

(52) U.S. Cl.
CPC ............ *H01L 33/60* (2013.01); *H01L 23/295* (2013.01); *H01L 33/46* (2013.01);
(Continued)

(58) Field of Classification Search
CPC ......... H01L 33/46; H01L 33/54; H01L 33/56; H01L 33/60
(Continued)

(56) References Cited

U.S. PATENT DOCUMENTS 7,183,589 B2  2/2007  Kameyama et al.
7,334,907 B2  2/2008  Nagayama
(Continued)

FOREIGN PATENT DOCUMENTS

DE  102 45 946 C1  10/2003
DE  102 29 067 A1  1/2004
(Continued)

OTHER PUBLICATIONS

English translation of Japanese Official Action dated Jan. 6, 2014 of corresponding Japanese Application No. 2013-515813.
(Continued)

*Primary Examiner* — Matthew E Warren
(74) *Attorney, Agent, or Firm* — DLA Piper LLP (US)

(57) ABSTRACT

An optoelectronic semiconductor device includes a carrier having a carrier top side, at least one optoelectronic semiconductor chip arranged at the carrier top side and having a radiation main side remote from the carrier top side, at least one bonding wire, at least one covering body on the radiation main side, and at least one reflective potting compound surrounding the semiconductor chip in a lateral direction and extending from the carrier top side at least as far as the radiation main side, wherein the bonding wire is completely covered by the reflective potting compound or completely covered by the reflective potting compound and the covering body, the bonding wire is fixed to the semiconductor chip in an electrical connection region on the radiation main side,
(Continued)

and the electrical connection region is free of the covering body and covered partly or completely by the reflective potting compound.

12 Claims, 6 Drawing Sheets

(51) Int. Cl.
*H01L 23/29* (2006.01)
*H01L 23/31* (2006.01)
*H01L 23/00* (2006.01)
*H01L 25/075* (2006.01)
*H01L 31/0232* (2014.01)
*H01L 33/54* (2010.01)
*H01L 33/62* (2010.01)
*H01L 25/16* (2006.01)
*H01L 23/60* (2006.01)
*H01L 33/56* (2010.01)

(52) U.S. Cl.
CPC .......... *H01L 23/3121* (2013.01); *H01L 23/60* (2013.01); *H01L 24/29* (2013.01); *H01L 24/32* (2013.01); *H01L 24/48* (2013.01); *H01L 24/73* (2013.01); *H01L 25/0753* (2013.01); *H01L 25/167* (2013.01); *H01L 31/0232* (2013.01); *H01L 33/54* (2013.01); *H01L 33/56* (2013.01); *H01L 33/62* (2013.01); *H01L 2224/291* (2013.01); *H01L 2224/2919* (2013.01); *H01L 2224/32225* (2013.01); *H01L 2224/32245* (2013.01); *H01L 2224/45015* (2013.01); *H01L 2224/48091* (2013.01); *H01L 2224/48227* (2013.01); *H01L 2224/48247* (2013.01); *H01L 2224/48471* (2013.01); *H01L 2224/48479* (2013.01); *H01L 2224/73265* (2013.01); *H01L 2924/00014* (2013.01); *H01L 2924/01013* (2013.01); *H01L 2924/01023* (2013.01); *H01L 2924/01079* (2013.01); *H01L 2924/05032* (2013.01); *H01L 2924/05432* (2013.01); *H01L 2924/12036* (2013.01); *H01L 2924/181* (2013.01); *H01L 2924/207* (2013.01)

(58) Field of Classification Search
USPC .......................................................... 257/98
See application file for complete search history.

(56) References Cited

U.S. PATENT DOCUMENTS

| | | | |
|---|---|---|---|
| 9,293,671 B2 | 3/2016 | Brunner et al. | |
| 2004/0089898 A1 | 5/2004 | Ruhnau et al. | |
| 2005/0218421 A1 | 10/2005 | Andrews et al. | |
| 2006/0138621 A1 | 6/2006 | Bogner et al. | |
| 2007/0166853 A1 | 7/2007 | Guenther et al. | |
| 2008/0054284 A1 | 3/2008 | Hussell et al. | |
| 2008/0054287 A1 | 3/2008 | Oshio et al. | |
| 2008/0138597 A1 | 6/2008 | Asai | |
| 2009/0026482 A1 | 1/2009 | Ruhnau et al. | |
| 2009/0321770 A1 | 12/2009 | Ajiki et al. | |
| 2010/0140648 A1 | 6/2010 | Harada et al. | |
| 2010/0193822 A1* | 8/2010 | Inobe ............... | H01L 33/54 257/98 |
| 2010/0320479 A1 | 12/2010 | Minato et al. | |
| 2011/0140284 A1 | 6/2011 | Günther et al. | |
| 2012/0286301 A1* | 11/2012 | Kobayakawa ....... | H01L 29/866 257/88 |
| 2012/0305961 A1 | 12/2012 | Chang | |
| 2012/0319563 A1 | 12/2012 | Ishihara et al. | |

FOREIGN PATENT DOCUMENTS

| | | |
|---|---|---|
| DE | 10 2004 021 233 A1 | 12/2005 |
| DE | 102010028407 A1 | 11/2011 |
| JP | 61-116702 A | 6/1986 |
| JP | 2006-173392 A | 6/2006 |
| JP | 2006-295132 A | 10/2006 |
| JP | 2007-42320 A | 2/2007 |
| JP | 2007-250629 A | 9/2007 |
| JP | 2008-135701 A | 6/2008 |
| JP | 2010-10261 A | 1/2010 |
| JP | 2010-21570 A | 1/2010 |
| TW | 200521291 A | 7/2005 |
| TW | 200635768 A | 10/2006 |
| TW | 201011871 A | 3/2010 |
| WO | 03/001253 A2 | 1/2003 |
| WO | 2007/072659 A1 | 6/2007 |
| WO | 2009/069671 | 6/2009 |

OTHER PUBLICATIONS

English translation of the Japanese Decision of Refusal dated Nov. 17, 2014 of corresponding Japanese Application No. 2013-515813.
English translation of the Taiwanese Examination Report dated Jan. 12, 2016 of corresponding Taiwanese Application No. 103141935.
Notice of Allowance dated May 21, 2018, of corresponding Korean Application No. 10-2018-7005274, along with an English translation.

* cited by examiner

OPTOELECTRONIC SEMICONDUCTOR COMPONENT

RELATED APPLICATIONS

This is a Divisional of U.S. application Ser. No. 13/703,127 filed Dec. 10, 2012, which is a § 371 of International Application No. PCT/EP2011/059738, with an international filing date of Jun. 10, 2011 (WO 2011/160968 A1, published Dec. 29, 2011, which is based on German Patent Application No. 10 2010 024 864.9 filed Jun. 24, 2010, the subject matter of which is incorporated herein by reference.

TECHNICAL FIELD

This disclosure relates to an optoelectronic semiconductor component.

BACKGROUND

US 2006/0138621 A1 provides an optoelectronic component and a module based on the optoelectronic component. There is nonetheless a need to provide an optoelectronic semiconductor component which exhibits high light outcoupling efficiency.

SUMMARY

We provide an optoelectronic semiconductor component including a carrier with a carrier top, at least one optoelectronic semiconductor chip mounted on the carrier top and including a main radiation side remote from the carrier top, at least one bonding wire, via which the semiconductor chip is electrically contacted, at least one covering body on the main radiation side that projects beyond the bonding wire in a direction away from the carrier top and perpendicular to the main radiation side, and at least one reflective potting compound laterally enclosing the semiconductor chip and extending from the carrier top at least as far as the main radiation side, wherein the bonding wire is completely covered by the reflective potting compound or completely covered by the reflective potting compound together with the covering body.

We also provide an optoelectronic semiconductor component including a carrier with a carrier top, at least one optoelectronic semiconductor chip mounted on the carrier top and including a main radiation side remote from the carrier top, at least one bonding wire via which the semiconductor chip is electrically contacted, at least one covering body on the main radiation side projecting beyond the bonding wire in a direction away from the carrier top and perpendicular to the main radiation side, and at least one reflective potting compound laterally enclosing the semiconductor chip and extending from the carrier top at least as far as the main radiation side, wherein the bonding wire is completely embedded in the reflective potting compound, the bonding wire is mounted on the semiconductor chip in an electrical connection zone on the main radiation side, the electrical connection zone is free of the covering body and completely covered by the reflective potting compound, the bonding wire extends in the connection zone parallel to the main radiation side with a tolerance of at most 10°, and the covering body is a disk and a thickness of the covering body is 50 μm to 250 μm.

We further provide an optoelectronic semiconductor device including a carrier having a carrier top side, at least one optoelectronic semiconductor chip arranged at the carrier top side and having a radiation main side remote from the carrier top side, at least one bonding wire via which electrical contact is made with the semiconductor chip, at least one covering body on the radiation main side that projects beyond the bonding wire in a direction away from the carrier top side and traverse or perpendicularly to the radiation main side, and at least one reflective potting compound surrounding the semiconductor chip in a lateral direction and extending from the carrier top side at least as far as the radiation main side, wherein the bonding wire is completely covered by the reflective potting compound or completely covered by the reflective potting compound and the covering body, the bonding wire is fixed to the semiconductor chip in an electrical connection region on the radiation main side, and the electrical connection region is free of the covering body and covered partly or completely by the reflective potting compound.

We yet further provide an optoelectronic semiconductor component including a carrier with a carrier top side, at least one optoelectronic semiconductor chip mounted on the carrier top side and including a main radiation side remote from the carrier top, at least one bonding wire, via which the semiconductor chip is electrically contacted, at least one covering body on the main radiation side projecting beyond the bonding wire in a direction away from the carrier top side and perpendicular to the main radiation side, at least one reflective potting compound laterally enclosing the semiconductor chip and extending from the carrier top side as far as the main radiation side, and at least one protection diode providing protection against electrostatic discharge, wherein the bonding wire is completely covered by the reflective potting compound or completely covered by the reflective potting compound together with the covering body, the covering body extends completely over the semiconductor chip and the protective diode, the top of the potting compound is paraboloidal in shape, and the bonding wire is embedded in the covering body.

DETAILED DESCRIPTION

Our optoelectronic semiconductor component may comprise a carrier with a carrier top. The carrier, for example, comprises a circuit board or a printed circuit board, PCB for short. The basic material of the carrier on which, for example, electrical conductor tracks are mounted, may be a ceramic such as an aluminium oxide or aluminium nitride. The carrier may likewise be based on a metal or be a metal core printed circuit board. The carrier may moreover take the form of a "Quad-Flat No-Leads Package", QFN for short.

The optoelectronic semiconductor component may comprise one or more optoelectronic semiconductor chips mounted on the carrier top. The semiconductor chips comprise a main radiation side remote from the carrier top. Electromagnetic radiation, for example, visible light generated in the semiconductor chips leaves the semiconductor chips predominantly or wholly via the main radiation side.

The semiconductor chips in particular are semiconductor chips based on a III-V semiconductor material. For example, the semiconductor chips are based on a nitride compound semiconductor material such as $Al_nIn_{1-n}Ga_mN$ or on a phosphide compound semiconductor material such as $Al_nIn_{1-}$ $_n$Ga$_m$P, wherein in each case 0≤n≤1, 0≤m≤1 and n+m≤1. In addition, the material may comprise one or more dopants and additional constituents. For simplicity's sake, however, only the fundamental constituents of the crystal lattice are indicated, i.e. Al, Ga, In, N or P, even if these may in part be replaced and/or supplemented by small quantities of further substances. The optoelectronic semiconductor chips are preferably designed to generate visible radiation, for example, in the blue, green, yellow and/or red spectral range when the semiconductor component is in operation. Radiation is generated in at least one active zone, which contains at least one quantum well structure and/or at least one pn junction.

The semiconductor chip may be electrically contacted via at least one bonding wire, preferably via precisely one bonding wire. The bonding wire connects to the semiconductor chip on the main radiation side. In particular the bonding wire connects a conductor track on the carrier top with a current spreading pattern on the main radiation side of the semiconductor chip. Electrical contacts of the semiconductor chip are preferably located on mutually facing major sides of the semiconductor chip.

The semiconductor component may comprise at least one covering body mounted on the main radiation side of the semiconductor chip. The covering body may be restricted to the main radiation side or indeed project beyond the semiconductor chip in a lateral direction, i.e. in a direction parallel to the main radiation side. Furthermore, the covering body projects beyond the bonding wire in a direction away from the carrier top and perpendicular to the main radiation side. In other words, when viewed in a projection onto a plane perpendicular to the main radiation side, the bonding wire may lie wholly between the carrier top and the top of the covering body, which is remote from the carrier top.

The optoelectronic semiconductor component may comprise at least one reflective potting compound. The potting compound completely or partly encloses the semiconductor chip in a lateral direction. When viewed from the carrier top, the potting compound extends at least as far as the main radiation side, for example, with a tolerance of at most 15 μm or of at most 5 μm. The reflective potting compound is preferably in direct contact with the semiconductor chip at least in places in the lateral direction.

The bonding wire may be completely covered by the reflective potting compound or alternatively completely covered by the reflective potting compound together with the covering body. In other words, in a direction away from the carrier top, the bonding wire does not project out of the reflective potting compound or out of the reflective potting compound together with the covering body. The bonding wire is in particular not exposed at any point, i.e. in a direction perpendicular to and away from the carrier top every portion of the bonding wire is succeeded by a material of the reflective potting compound and/or a material of the covering body.

The optoelectronic semiconductor component may comprise a carrier with a carrier top and at least one optoelectronic semiconductor chip mounted on the carrier top and which comprises a main radiation side remote from the carrier top. In addition, the semiconductor component includes at least one bonding wire via which the semiconductor chip is electrically contacted, and at least one covering body mounted on the main radiation side and which projects beyond the bonding wire, in a direction away from the carrier top and perpendicular to the main radiation side. At least one reflective potting compound laterally encloses the semiconductor chip and extends, when viewed from the carrier top, at least as far as the main radiation side of the semiconductor chip. The bonding wire is completely covered by the reflective potting compound or completely covered by the reflective potting compound together with the covering body.

Such a reflective potting compound makes it possible to achieve radiation emission in particular solely at the main radiation side of the semiconductor chip. In addition, shading effects or undesired reflections at the bonding wire may be reduced or prevented such that the efficiency of radiation outcoupling out of the semiconductor component may be increased.

The bonding wire may be completely embedded in the reflective potting compound. In particular, the reflective potting compound encloses the wire in a form-fitting manner and is in direct contact with the bonding wire. The bonding wire is thus, for example, directly encapsulated by the reflective potting compound. Completely embedded may mean that the bonding wire is solely in contact first with the reflective potting compound and/or second with electrical connection zones, with which the bonding wire is electrically conductively connected and to which the bonding wire is bonded, and/or third with an electrical connector, with which the bonding wire is fastened to the connection zones.

The reflective potting compound extends, when viewed from the carrier top, as far as the top of the covering body remote from the carrier top. In particular, the reflective potting compound terminates at a lateral boundary face of the covering body in a direction away from the carrier top, flush with or flush within the bounds of manufacturing tolerances with the body top. Manufacturing tolerances amount to at most 10 μm, for example.

The top of the covering body may be provided with a non-stick layer. The non-stick layer does not wet the material of the reflective potting compound. The non-stick layer consists of or comprises, for example, a polyhalogenolefin, in particular a fluorine-containing compound such as polytetrafluoroethylene. Preferably, the non-stick layer is transparent to radiation generated directly in the semiconductor chip and/or to radiation generated in the covering body by wavelength conversion.

The top of the reflective potting body remote from the carrier top may extend flush with and/or parallel to the top of the covering body. Tolerance with regard to flushness and/or parallelism amounts, for example, to at most 30 μm or at most 10 μm in a direction perpendicular to the body top. The potting top may extend parallel to the carrier top within the bounds of manufacturing tolerances.

The carrier top, when viewed in plan view, may be covered completely by the reflective potting compound together with the covering body. In other words, every portion of the carrier top may be succeeded by the material of the potting compound and/or of the covering body in a direction perpendicular to and away from the carrier top. In particular, every portion of the carrier top is succeeded by either the material of the potting compound or the material of the covering body.

The main radiation side of the semiconductor chip may comprise an electrical connection zone. The electrical connection zone may be a bond pad. In particular, in the connection zone the bonding wire is connected electrically and mechanically to the semiconductor chip. The semiconductor chip preferably has precisely one electrical connection zone on the main radiation side. Starting from the connection zone, structures for current distribution may be located on the main radiation side, for example, narrow, metallic webs.

The electrical connection zone may be free of the covering body on the main radiation side. In other words, no covering body material succeeds the connection zone in a direction away from the carrier top. The connection zone also preferably does not touch the covering body.

The electrical connection zone may be covered wholly or partly by the reflective potting compound on the main radiation side. Thus, in a direction perpendicular to and away from the main radiation side, every portion of the connection zone is succeeded by a material of the reflective potting compound.

The bonding wire may extend in the electrical connection zone on the main radiation side, with a tolerance of at most 20° or of at most 10°, parallel to the main radiation side and/or parallel to the carrier top and/or parallel to the top of the covering body. Particularly preferably, the bonding wire also extends around the electrical connection zone in a region in the immediate vicinity thereof, parallel to the main radiation side. For example, the region in the immediate vicinity comprises a diameter which corresponds to at least twice or at least five times the average diameter of the electrical connection zone on the main radiation side.

The covering body may take the form of a wafer (also referred to as disk or plate) and is preferably limited to the main radiation side. In other words, the covering body extends further laterally than heightwise. The fact that the covering body is limited to the main radiation side means that the covering body does not project laterally beyond the main radiation side, with a tolerance, for example, of at most 50 µm or of at most 15 µm. Taking the form of a wafer may additionally mean that two major sides of the covering body are oriented parallel to one another within the bounds of manufacturing tolerances.

The covering body may have a thickness of 50 µm to 250 µm, in particular 50 µm to 120 µm.

The reflective potting compound may comprise a clear, transparent matrix material, reflective particles being embedded in the matrix material. The particles are, for example, white and diffusely reflective. The matrix material particularly preferably exhibits a Shore A hardness at room temperature of at most 50 or of at most 40. In other words, the matrix material is comparatively soft.

The particles may comprise or consist of a particulate material which is a metal oxide. The metal oxide is, for example, titanium dioxide.

The proportion by weight of the reflective particles, relative to the total reflective potting compound, may be 10% to 40%, in particular 20% to 30%.

A reflection coefficient of the reflective potting compound amounts for visible radiation, for example, for radiation in the wavelength range of 450 nm to 700 nm, to at least 85% or, preferably, at least 90% or at least 93%.

The potting compound may appear white when the potting compound is viewed in plan view and in particular in a region around the semiconductor chip. In other words, a concentration of the particles is, for example, established such that the potting compound gives an observer the impression of a white colour.

The reflective potting compound may completely enclose the semiconductor chip all around when viewed in the lateral direction and is constructed form-fittingly with the lateral boundary faces of the semiconductor chip. Also preferably, the reflective potting compound likewise encloses the bonding wire and/or the covering body completely all around in form-fitting manner in the lateral direction.

The optoelectronic semiconductor component may comprise a housing with a cavity, wherein the semiconductor chip, the covering body, the bonding wire and the reflective potting compound are each located in the cavity and wherein the semiconductor chip is mounted on the carrier top. In this case, the reflective potting compound preferably extends, in a lateral direction, from the semiconductor chip as far as lateral boundary faces of the cavity such that no air gap or no gap filled with a further material arises between the lateral boundary faces of the cavity and the semiconductor chip.

The reflective potting compound may wet the lateral boundary faces of the cavity. In other words, a concave meniscus may form at the lateral boundary faces and on manufacture of the semiconductor component the reflective potting compound may creep along the lateral boundary faces of the cavity away from the carrier top.

The thickness of the potting compound may be at least 50 µm and/or at most 400 µm greater directly at the lateral boundary faces of the cavity than directly at the semiconductor chip. In other words, it is possible for the reflective potting compound to form a paraboloidal reflector, wherein the thickness of the potting compound, with a tolerance of at most 30 µm, increases constantly in a direction away from the semiconductor chip. This is not hindered by the fact that a comparatively small meniscus of the potting compound may likewise form within the stated tolerance, for example, at lateral boundary faces of the covering body.

An optoelectronic semiconductor component described herein will be explained in greater detail below by way of examples with reference to the Drawings. Elements which are the same in the individual figures are indicated with the same reference numerals. The relationships between the elements are not shown to scale, however, but rather individual elements may be shown exaggeratedly large to assist in understanding.

Figure 1:
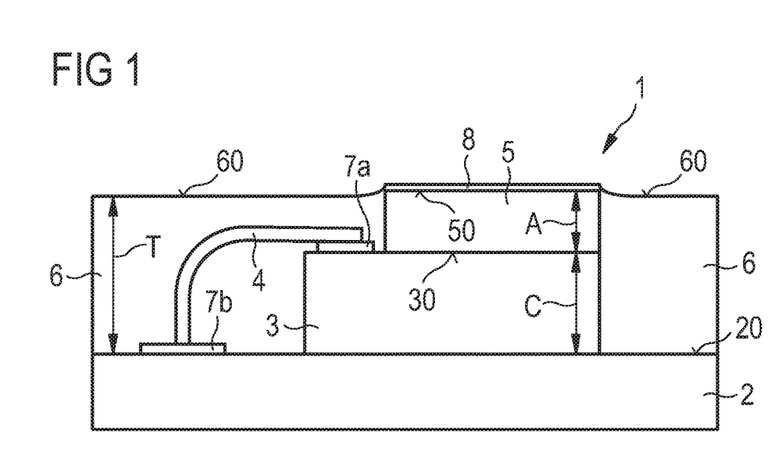
FIGS. 1 to 7 show schematic representations of examples of our optoelectronic semiconductor components.

FIG. 1 is a schematic sectional representation of an example of an optoelectronic semiconductor component 1. An optoelectronic semiconductor chip 3 is mounted on the planar top 20 of a carrier 2. The semiconductor chip 3 comprises a main radiation side 30 remote from the carrier 2. A covering body 5 is mounted on the main radiation side 30, with a planar top 50 remote from the semiconductor chip 3. The covering body 5 takes the form of a wafer and has a thickness A of approx. 100 µm, for example. The thickness C of the semiconductor chip is, for example, 30 µm to 250 µm, in particular around approx. 120 µm. A portion in a corner of the main radiation side 30 in which an electrical connection zone 7a is located is not covered by the covering body 5.

Electrical contacting of the semiconductor chip 3 proceeds via a bonding wire 4, which extends from an electrical connection zone 7b on the carrier top 20 as far as the connection zone 7a on the main radiation side 30. In a region around the connection zone 7a the bonding wire 4 extends approximately parallel to the main radiation side 30, for example, with a tolerance of at most 20°. In contrast to what is shown in FIG. 1, it is possible for the spacing between the bonding wire 4 and the carrier top 20 to decrease constantly from the connection zone 7a towards the connection zone 7b, in particular if the connection zone 7a is constructed in the manner of a platform.

In the lateral direction a reflective potting compound 6 encloses the semiconductor chip 3, the covering body 5 and the bonding wire 4 in a form-fitting manner. The bonding wire 4 is embedded completely in the reflective potting compound 6. The thickness T of the potting compound 6 corresponds, for example, to a tolerance of at most 5% or of at most 10%, to the total of the thicknesses A, C of the covering body 5 and of the semiconductor chip 3. Within the bounds of manufacturing tolerances, the top 60 of the potting compound 6 remote from the carrier 2 is oriented parallel to the carrier top 20 and to the body top 50 and terminates flush with the body top 50 within the bounds of manufacturing tolerances. The potting compound 6, for example, comprises a transparent silicone or a transparent silicone-epoxy hybrid material in which reflective particles, in particular of titanium dioxide, are embedded. The connection zone 7a on the main radiation side 30 is covered completely by the potting compound 6.

At lateral boundary faces of the covering body 5 a concave meniscus may form on the top 60 of the potting compound 6 remote from the carrier 2. The top 50 of the covering body 5 is preferably provided with a non-stick layer 8 which prevents the body top 50 from being wetted by the material of the potting compound 6. The thickness of the non-stick layer 8 is, for example, 10 nm to 1 µm, in particular 25 nm to 200 nm. The non-stick layer preferably comprises a fluorinated material, for example, a TEFLON®-like material.

The covering body 5 is adhesively bonded, for example, to the main radiation side 30 or printed directly onto the main radiation side 30. Unlike in the illustration, a plurality of covering bodies, which perform different functions and are, for example, transparent and diffusely scattering or comprise a conversion medium, may succeed one another in a direction away from the carrier top 20. It is likewise possible for the covering body 5 in each case to comprise on its top 50 a roughened pattern for improving light outcoupling or to be provided, in addition to or as an alternative to the non-stick layer 8, with an antireflective coating or with a particularly hard coating resistant to mechanical stress.

Unlike in FIG. 1, it is possible, as also in all the other examples, for the optoelectronic semiconductor chip 3 to be electrically contacted via two bonding wires 4 on the main radiation side 30 and for the semiconductor chip 3 then to take the form of a "flip-chip".

FIGS. 2A to 2E are schematic, perspective representations of a method of producing an example of the optoelectronic semiconductor component 1.

Figure 2A:
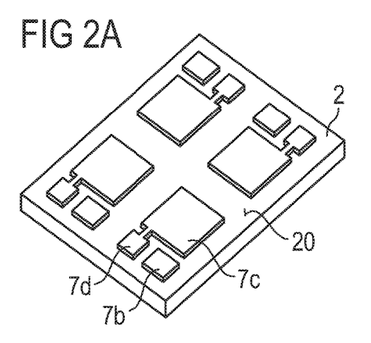

In FIG. 2A the carrier 2 is provided. The carrier 2 comprises electrical connection zones 7b, 7c, 7d on the carrier top 20. The connection zones 7b, 7d are preferably connected by way of vias to electrical conductor tracks, not shown, on the bottom of the carrier 2.

Figure 2B:
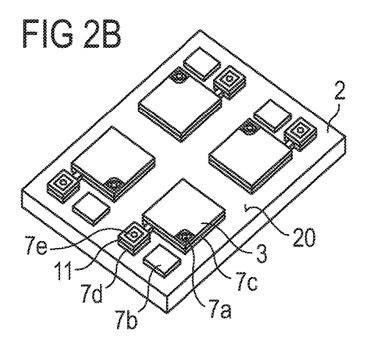

According to FIG. 2B the plurality of semiconductor chips 3 are mounted on the connection zones 7c, for example, by soldering or electrically conductive adhesion. Protection diodes 11 providing protection against electrostatic discharge are mounted on the connection zones 7d. The semiconductor chips 3 may be semiconductor chips of identical construction or indeed different semiconductor chips, e.g. semiconductor chips emitting in different spectral ranges.

Figure 2C:
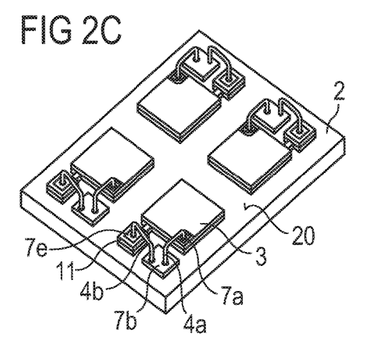

In FIG. 2C the bonding wires 4a, 4b connect to the connection zones 7a, 7e of the semiconductor chip 3 and to the protection diode 11, starting from the connection zone 7b on the carrier top 20. The bonding wires 4a, 4b are preferably first connected to the carrier top 20 and then to the semiconductor chip 3 and to the protection diode 11.

Figure 2D:
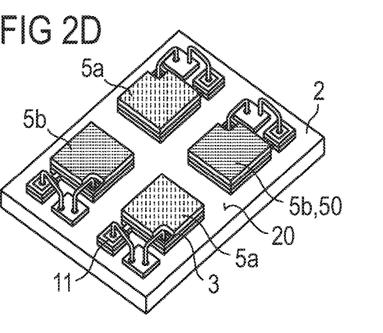

In FIG. 2D, the covering bodies 5a, 5b are applied to the semiconductor chips 3. The covering bodies 5a are, for example, clear, transparent wafers, preferably of a thickness such that in a direction away from the carrier 2, they terminate flush with the covering bodies 5b. The covering bodies 5b contain a conversion medium designed to convert at least some of the radiation emitted by the semiconductor chips 3 into radiation of a different wavelength. For example, the semiconductor chips 3 associated with the covering bodies 5b emit blue light and the semiconductor chips 3 associated with the covering bodies 5a emit blue light or red light. Alternatively, the semiconductor chips 3 may each be semiconductor chips of identical construction. Covering bodies 5a, 5b of identical construction may likewise be used.

Figure 3:
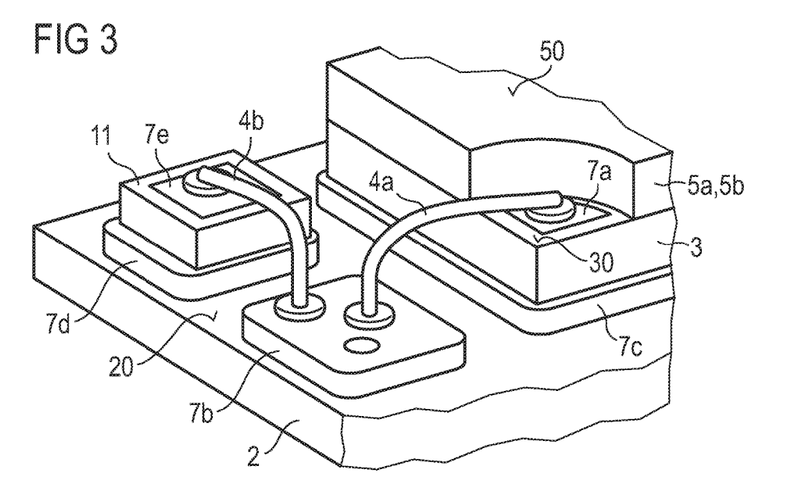

FIG. 3 provides a more detailed illustration of the bonding wires 4a, 4b. The covering bodies 5a, 5b project beyond the bonding wires 4a, 4b in a direction away from the carrier top 20. The bonding wires 4a, 4b comprise different radii of curvature over their course. Over the electrical connection zone 7b on the carrier top 20 the radius of curvature of the bonding wires 4a, 4b is in particular smaller than in a region close to the connection zone 7a, 7e on the sides of the semiconductor chip 3 and the protection diode 11 remote from the carrier 2.

Figure 2E:
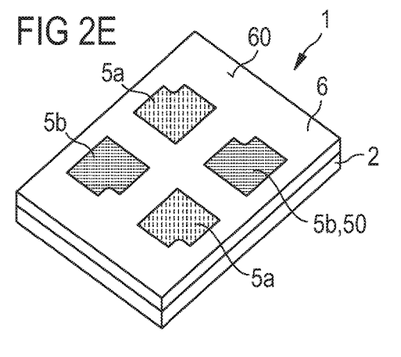

In FIG. 2E, the semiconductor chips 3 and the covering bodies 5a, 5b and the bonding wires 4a, 4b are encapsulated by the reflective potting compound 6 and enclosed laterally. The covering bodies 5a, 5b and the potting compound 6 completely cover the carrier 2, in a direction away from the carrier top 20. The bonding wires 4a, 4b are completely embedded in the potting compound 6. The top 60 of the potting compound extends approximately parallel to the carrier top 20 and, with the exception of concave menisci, which form at lateral boundary faces of the covering bodies 5a, 5b, is planar in shape and terminates flush with the body tops 50.

The potting compound 6 makes it possible to prevent any radiation which has not passed through the covering bodies 5b from leaving the semiconductor chips 3 associated with covering bodies 5b with the conversion medium. In this way particularly homogeneous spectral emission and high conversion efficiency may be achieved.

According to FIG. 2E, the semiconductor component 1 may optionally be singulated into semiconductor components with in each case a plurality of or in each case precisely one semiconductor chip 3.

Figure 4:
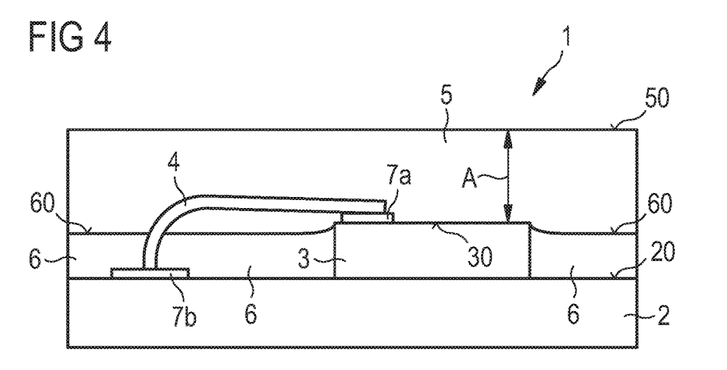
Figure 5A:
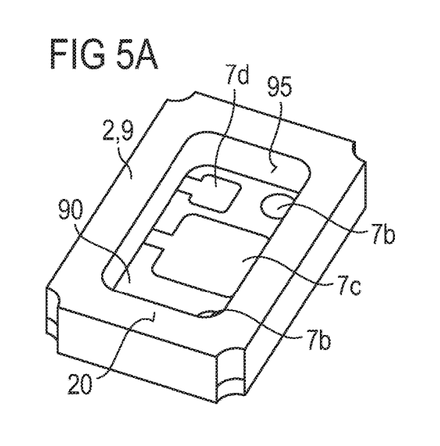
Figure 5B:
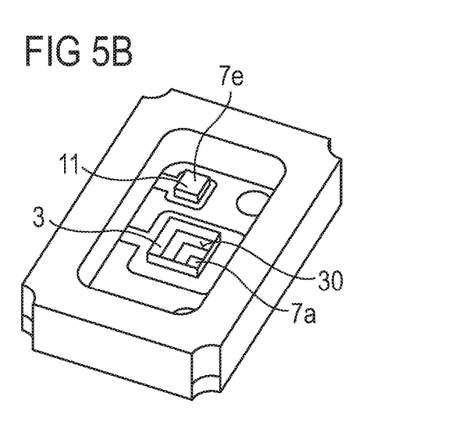
Figure 5C:
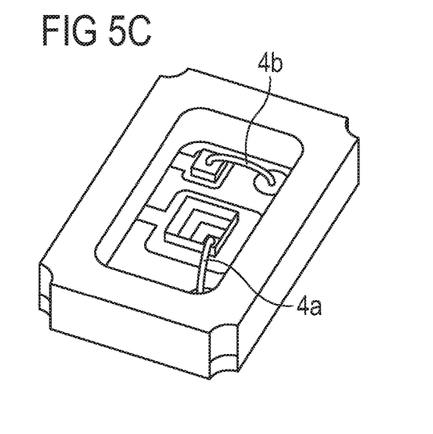
Figure 5D:
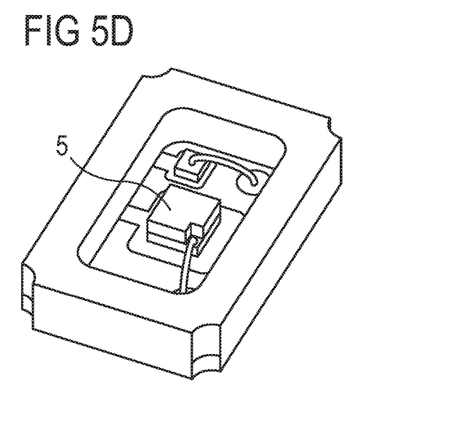
Figure 5E:
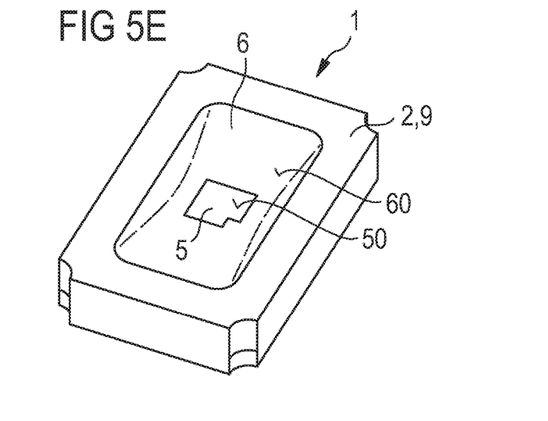

FIG. 4 shows a further example of the semiconductor component 1 in a sectional representation. Unlike in FIG. 1, the bonding wire 4 is embedded into the potting compound 6 together with the covering body 5. The reflective potting compound 6 extends, when viewed from the carrier top 20, only as far as the main radiation side 30. The covering body 5 extends completely or substantially completely over the entire carrier top 20. The body top 50 is preferably planar in shape. The thickness A of the covering body 5 is preferably 50 µm to 150 µm. The covering body 5 is preferably clear and transparent. It is likewise possible for the covering body 5 to contain a filter medium and/or a conversion medium, as also in all the other examples.

In the example according to FIGS. 5A to 5E, which show a production process for a further example of the semiconductor component 1, as in FIGS. 2A to 2E, the carrier 2 comprises a housing 9 with a cavity 90. Lateral boundary faces 95 of the cavity 90 are oriented approximately perpendicular to the carrier top 20, on which the electrical connection zones 7b, 7c, 7d are mounted. The lateral boundary faces 95 have a wetting effect relative to the reflective potting compound 6 such that a reflector trough is formed by the top 60 of the reflective potting compound 6 when the cavity 90 is filled with said compound. The top 60 of the potting compound is preferably paraboloidal in shape.

The lateral dimensions of the carrier 2 vary, for example, from 1 mm×2 mm to 4 mm×8 mm, as also in all the other examples. The semiconductor components 1 are thus of comparatively compact structure. Optionally, cylindrical recesses may be formed at corners of the housing 9 and of the carrier 2, which recesses constitute adjusting aids or mounting aids, for example.

Figure 6A:
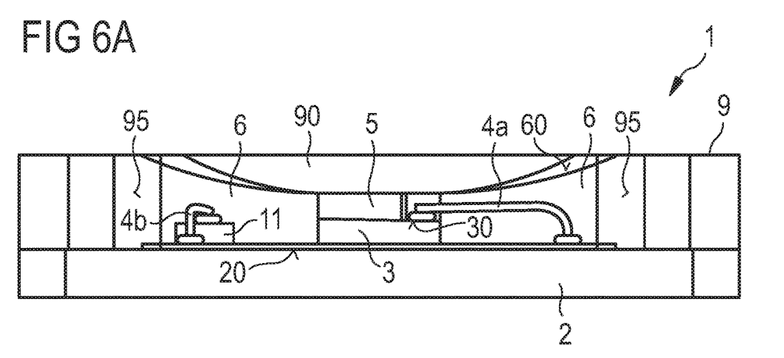
Figure 6B:
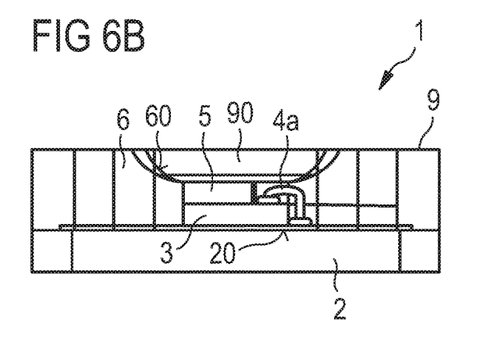
Figure 6C:
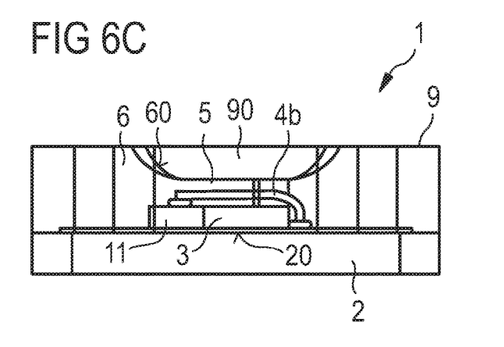

A further example of the semiconductor component 1 with the housing 9 is illustrated in the schematic sectional representations according to FIGS. 6A to 6C. As in all the other examples, the top 60 of the potting compound is preferably not succeeded by any further potting compound. The top 60 of the potting compound in particular adjoins air. Alternatively, it is possible for an optical system, not shown in the figures, for example, a lens, to be arranged over the top 60 of the potting compound and/or over the housing 9.

Figure 7:
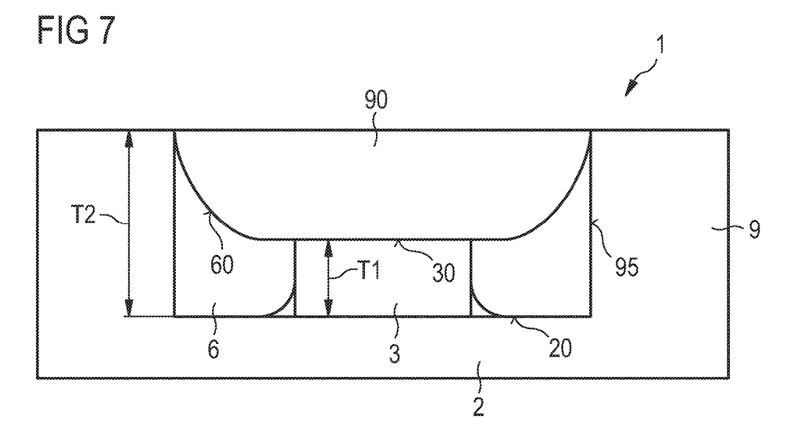

FIG. 7 is a sectional representation of a further example of the semiconductor component 1. To simplify the illustration, FIG. 7 does not show the covering body and the bonding wire. A paraboloidal reflector is formed by the top 60 of the potting compound. At the lateral boundary faces 95 the potting compound 6 creeps upward during production. At the semiconductor chip 3 the potting compound 6 has a thickness T1 and at the lateral boundary faces 95 a thickness T2. The difference between the thicknesses T1, T2 is, for example, 50 µm to 400 µm or 75 µm to 300 µm. The lateral extent of the potting compound 6 between the lateral boundary faces 95 of the housing 9 and the semiconductor chip 3 amounts, for example, to 100 µm to 1 mm, in particular 150 µm to 500 µm, for example, approx. 350 µm. The potting compound 6 is in direct contact with the semiconductor chip 3 and with the lateral boundary faces 95. At lateral boundary faces of the semiconductor chip 3 there may be located fillet-like parts of a connector with which the semiconductor chip 3 is mounted on the carrier 2.

FIG. 7 shows that the thickness T of the potting compound 6 may initially decrease slightly away from the semiconductor chip 3 and then increase again constantly towards the lateral boundary faces 95. The decrease in the thickness T, away from the semiconductor chip 3, preferably amounts to at most 30 µm or at most 20 µm and may be attributed to formation of a small concave meniscus at the semiconductor chip 3 or at the covering body. Beam shaping by the top 60 of the potting compound is not affected or is barely affected by this local minimum thickness T of the potting body 6.

The component described herein is not restricted by the description given with reference to the examples. Rather, the disclosure encompasses any novel feature and any combination of features, including in particular any combination of features in the appended claims, even if the feature or combination is not itself explicitly indicated in the claims or examples.

What is claimed is:

1. An optoelectronic semiconductor device comprising
a carrier having a carrier top side,
at least one optoelectronic semiconductor chip arranged at the carrier top side and having a radiation main side remote from the carrier top side,
at least one bonding wire via which electrical contact is made with the semiconductor chip,
at least one covering body on the radiation main side that projects beyond the bonding wire in a direction away from the carrier top side and traverse or perpendicularly to the radiation main side, and
at least one reflective potting compound surrounding the semiconductor chip in a lateral direction and extending from the carrier top side at least as far as the radiation main side, wherein
the bonding wire is completely covered by the reflective potting compound or completely covered by the reflective potting compound and the covering body,
the bonding wire is fixed to the semiconductor chip in an electrical connection region on the radiation main side, and
the electrical connection region is free of the covering body and covered partly or completely by the reflective potting compound.

2. The optoelectronic semiconductor component according to claim 1, wherein a top portion of the covering body is provided with a non-stick layer that does not wet the material of the reflective potting compound.

3. The optoelectronic semiconductor component according to claim 1, wherein a potting compound top remote from the carrier top side extends, with a tolerance of at most 30 µm, flush with and parallel to the top of the covering body.

4. The optoelectronic semiconductor component according to claim 1, wherein the carrier top side, when viewed in plan view, is completely covered by the reflective potting compound together with the covering body.

5. The optoelectronic semiconductor component according to claim 1, wherein the bonding wire extends in the connection zone parallel to the main radiation side, with a tolerance of at most 20°.

6. The optoelectronic semiconductor component according to claim 1, wherein the covering body is a wafer and limited to the main radiation side, and a thickness of the covering body is 50 µm to 250 µm.

7. The optoelectronic semiconductor component according to claim 1, wherein the reflective potting compound comprises a transparent matrix material and reflective particles embedded therein, and at room temperature the matrix material has a Shore A hardness of at most 50.

8. The optoelectronic semiconductor component according to claim 7, wherein a particulate material from which the reflective particles are formed is a metal oxide, and a proportion by weight of the particles in the reflective potting compound is 10% to 40%.

9. The optoelectronic semiconductor component according to claim 1, wherein the reflective potting compound encloses the semiconductor chip, the bonding wire and the covering body form-fittingly and completely all around in the lateral direction.

10. The optoelectronic semiconductor component according to claim 1, further comprising a housing with a cavity, wherein the semiconductor chip, the covering body and the reflective potting compound are arranged on the carrier top in the cavity,
wherein the reflective potting compound extends from the semiconductor chip as far as lateral boundary faces of the cavity.

11. The optoelectronic semiconductor component according to claim 10, wherein the reflective potting compound wets the lateral boundary faces of the cavity, and
the thickness of the potting compound at the lateral boundary faces is at least 50 µm and at most 400 µm greater than at the semiconductor chip.

12. An optoelectronic semiconductor component comprising:
a carrier with a carrier top side, at least one optoelectronic semiconductor chip mounted on the carrier top side and comprising a main radiation side remote from the carrier top, at least one bonding wire, via which the semiconductor chip is electrically contacted, at least one covering body on the main radiation side projecting beyond the bonding wire in a direction away from the carrier top side and perpendicular to the main radiation side, at least one reflective potting compound laterally enclosing the semiconductor chip and extending from the carrier top side as far as the main radiation side, and at least one protection diode providing protection against electrostatic discharge, wherein the bonding wire is completely covered by the reflective potting compound or completely covered by the reflective potting compound together with the covering body, the covering body extends completely over the semiconductor chip and the protective diode, the top of the potting compound is paraboloidal in shape, and the bonding wire is embedded in the covering body.

* * * * *